(12) United States Patent
Hong

(10) Patent No.: US 9,034,762 B2
(45) Date of Patent: May 19, 2015

(54) TRIPLE PATTERNING METHOD

(71) Applicant: Semiconductor Manufacturing International (Shanghai) Corporation, Shanghai (CN)

(72) Inventor: Zhongshan Hong, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/188,945

(22) Filed: Feb. 25, 2014

(65) Prior Publication Data

US 2015/0061087 A1    Mar. 5, 2015

(30) Foreign Application Priority Data

Sep. 4, 2013  (CN) .......................... 2013 1 0398705

(51) Int. Cl.
*H01L 21/033* (2006.01)
*H01L 21/308* (2006.01)
*H01L 29/02* (2006.01)

(52) U.S. Cl.
CPC .............. *H01L 21/308* (2013.01); *H01L 29/02* (2013.01); *Y10S 438/95* (2013.01)

(58) Field of Classification Search
CPC ............ H01L 21/3086; H01L 21/3038; H01L 21/0337; G03F 7/0035
USPC .......................................... 438/696, 736, 950
See application file for complete search history.

(56) References Cited

U.S. PATENT DOCUMENTS

| | | | | |
|---|---|---|---|---|
| 2006/0046484 | A1* | 3/2006 | Abatchev et al. | 438/689 |
| 2007/0224823 | A1* | 9/2007 | Sandhu | 438/694 |
| 2009/0140398 | A1* | 6/2009 | Jung | 257/638 |
| 2009/0170326 | A1* | 7/2009 | Jung | 438/694 |
| 2009/0311861 | A1* | 12/2009 | Park et al. | 438/689 |
| 2010/0136791 | A1* | 6/2010 | Lai et al. | 438/703 |
| 2010/0330503 | A1* | 12/2010 | Bae et al. | 430/312 |
| 2011/0250757 | A1* | 10/2011 | Sukekawa et al. | 438/703 |
| 2012/0085733 | A1* | 4/2012 | Mebarki et al. | 216/37 |
| 2013/0189845 | A1* | 7/2013 | Kim et al. | 438/696 |
| 2015/0061087 | A1* | 3/2015 | Hong | 257/635 |
| 2015/0064906 | A1* | 3/2015 | Sel et al. | 438/694 |
| 2015/0064907 | A1* | 3/2015 | Sel et al. | 438/694 |

* cited by examiner

*Primary Examiner* — George Fourson, III
(74) *Attorney, Agent, or Firm* — Anova Law Group, PLLC

(57) ABSTRACT

A triple patterning method is provided. The method includes providing a substrate having a first region and a second region; and forming a first material layer. The method also includes forming a second material layer; and forming a plurality of core patterns on the second material layer in the first region. Further, the method includes forming sidewall spacers on side surfaces of the core patterns; and forming first patterns on the first material layer. Further, the method includes forming a third material layer on the first material layer and the first patterns; and forming second patterns on the third material layer in the first region and third patterns on the third material layer in the second region. Further, the method also includes forming fourth patterns; and forming triple patterns on the substrate in the first region and fifth patterns on the substrate in the second region.

16 Claims, 6 Drawing Sheets

TRIPLE PATTERNING METHOD

CROSS-REFERENCES TO RELATED APPLICATIONS

This application claims the priority of Chinese patent application No. 201310398705.9, filed on Sep. 4, 2013, the entirety of which is incorporated herein by reference.

FIELD OF THE INVENTION

The present invention generally relates to the field of semiconductor manufacturing technology and, more particularly, relates to a triple patterning method.

BACKGROUND

In the field of semiconductor manufacturing, photoresist is often used to transfer patterns on a photomask into one or more layers of materials. For example, the patterns of the photomasks can be transferred into metal material layer(s), dielectric material layer(s), or semiconductor substrate(s), etc. With the continuously shrinking of the critical dimension (CD) of the semiconductor technology, it has become more and more difficult to form the photomask patterns with a substantially small CD into the material layer(s) using a photolithography process.

In order to reduce the optical proximity effect caused by the substantially small CD during the photolithography process, resolution enhancement techniques (RETs) have been developed. The RETs include the scattering bar technology, the phase-shift mask technology, the double patterning technology (DPT), and the triple patterning technology (TPT), etc. Amongst of these RETs, the DPT and the TPTs are considered as effective methods to bridge the gap between the immersion lithography and the extreme ultraviolet lithography. Comparing with the DPT, the TPT may obtain a smaller CD and a higher device pattern density, thus it has been used more and more often.

FIGS. 1~4 illustrate an existing triple patterning process. As shown in FIG. 1, the triple patterning process includes providing a substrate 100; forming a plurality of discrete first patterns 101; and forming first sidewall spacers 102 on side surfaces of the first patterns 101.

Further, as shown in FIG. 2, the triple patterning process also includes forming a material layer 103 covering the substrate 100, the first sidewall spacers 102 and the first patterns 101.

Further, as shown in FIG. 3, the triple patterning process also includes etching the material layer 103 by a mask-less etching process to form second sidewall spacers 104 on the side surfaces of the first sidewall spacers 102.

Further, as shown in FIG. 4, the triple patterning process also includes removing the first sidewalls spacers 102; and the remaining first patterns 101 and the second sidewall spacers 104 form the triple patterns 105.

However, such a triple patterning process may be limited in its applications, and may be unable to the match diversified needs of the semiconductor manufacturing. The disclosed device structures and methods are directed to solve one or more problems set forth above.

BRIEF SUMMARY OF THE DISCLOSURE

One aspect of the present disclosure includes a triple patterning method. The method includes providing a substrate having a first region and a second region; and forming a first material layer on the substrate. The method also includes forming a second material layer on the first material layer; and forming a plurality of core patterns on the second material layer in the first region. Further, the method includes forming sidewall spacers on side surfaces of the core patterns; and forming a plurality of first patterns on the first material layer. Further, the method includes forming a third material layer on the first material layer and the first patterns; and forming second patterns on the third material layer in the first region and third patterns on the third material layer in the second region. Further, the method also includes forming fourth patterns; and forming triple patterns on the substrate in the first region and fifth patterns on the substrate in the second region.

Another aspect of the present disclosure includes a semiconductor structure. The semiconductor structure includes a substrate having a first region and a second region. The semiconductor structure also includes a plurality of triple patterns formed on the substrate in the first region; and a plurality of fifth patterns with a size different from a size of the triple patterns formed on the semiconductor substrate in the second region.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Referring to FIGS. 1~4, the triple patterns 105 formed by the existing method may have a certain width and a certain distance between adjacent patterns 105, it may be unable to form patterns with a width different from the width of the triple patterns 105 on other regions of the substrate 100 with the triple patterns 105 simultaneously. Further, it may also be unable to form the triple patterns 105 and patterns with a distance between adjacent patterns different from the distance between adjacent triple patterns 105 simultaneously. If further processes are used to form the patterns with different widths or different adjacent pattern distances, the production cost may be increased. Therefore, the existing triple patterning method may be unable to match the diversified needs of semiconductor manufacturing. The disclosed triple patterning method solves the problem set forth above and other problems by forming patterns with different sizes and adjacent pattern distances on other regions on the substrate with triple patterns.

Figure 12:
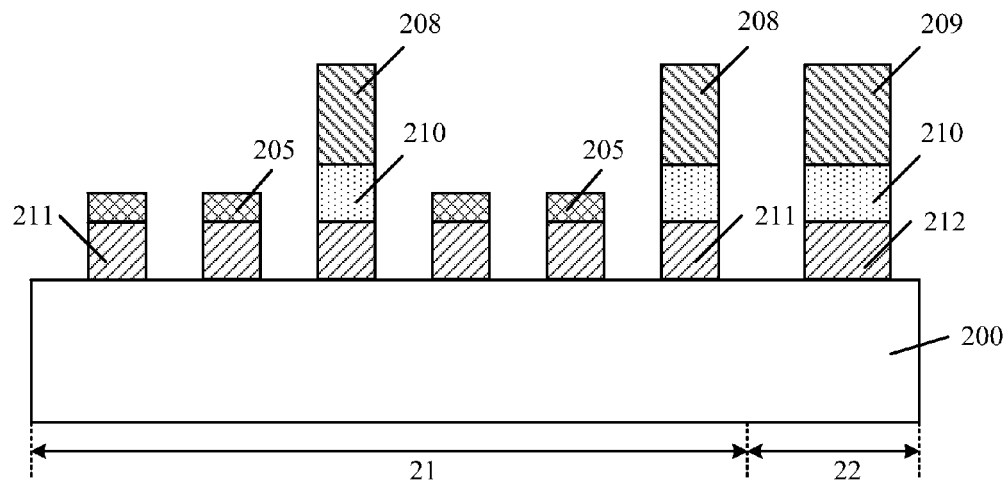
Figure 13:
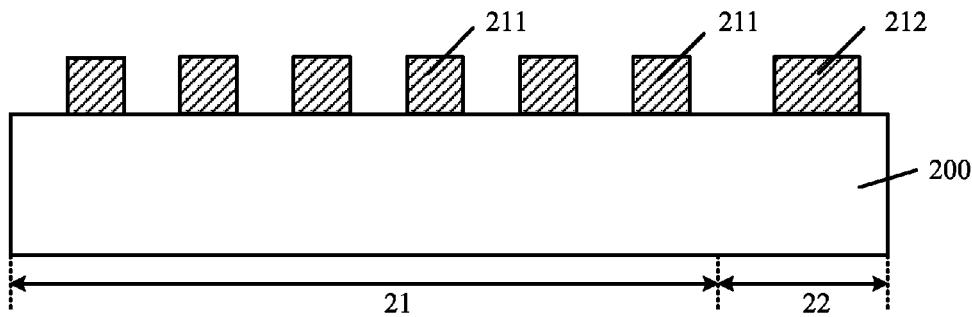
Figure 14:
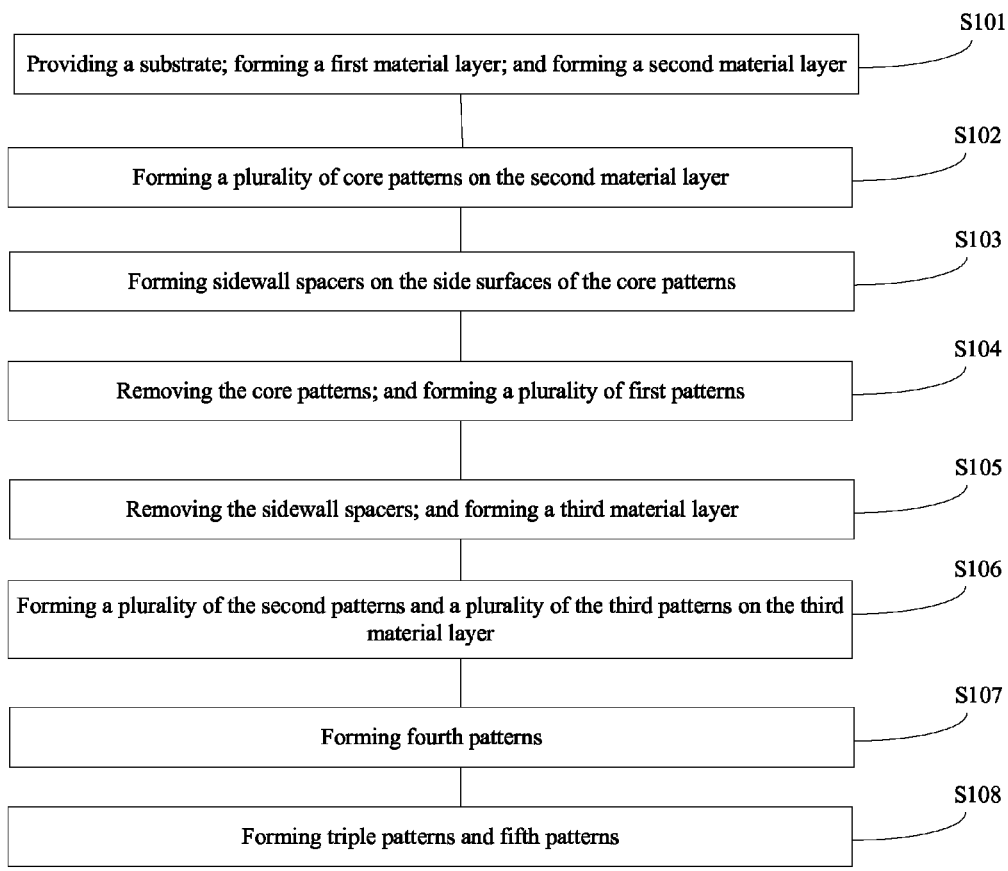
FIG. 14 illustrates an exemplary triple patterning process consistent with the disclosed embodiments.

FIG. 14 illustrates an exemplary triple patterning process consistent with the disclosed embodiments; and FIGS. 5~13 illustrate semiconductor structures corresponding to certain stages of the exemplary triple patterning process.

Figure 1:
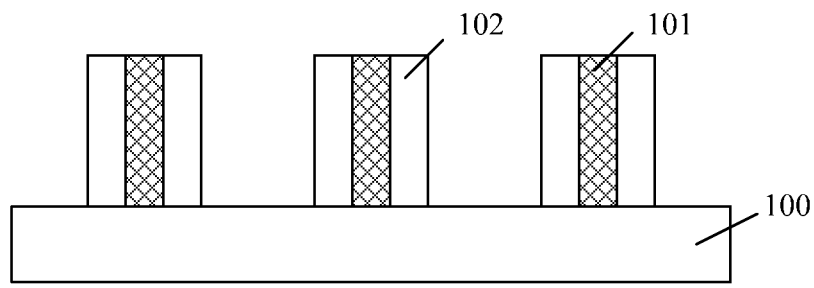
FIGS. 1~4 illustrate an existing triple patterning process.
Figure 2:
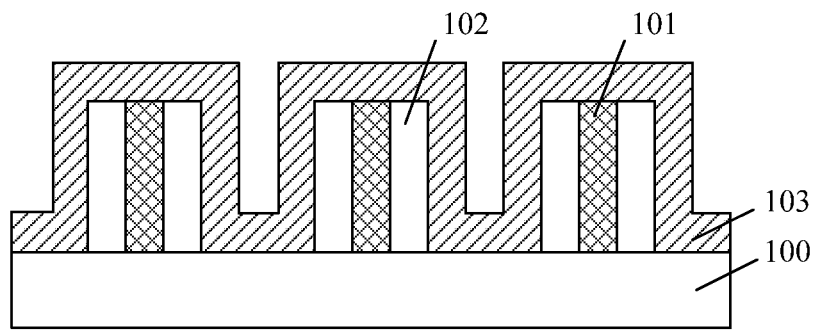
Figure 3:
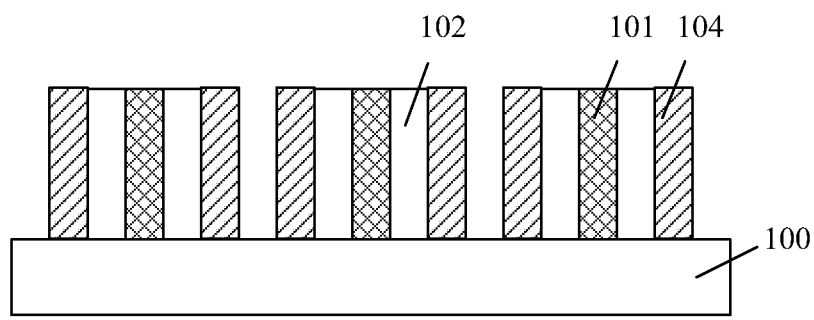
Figure 4:
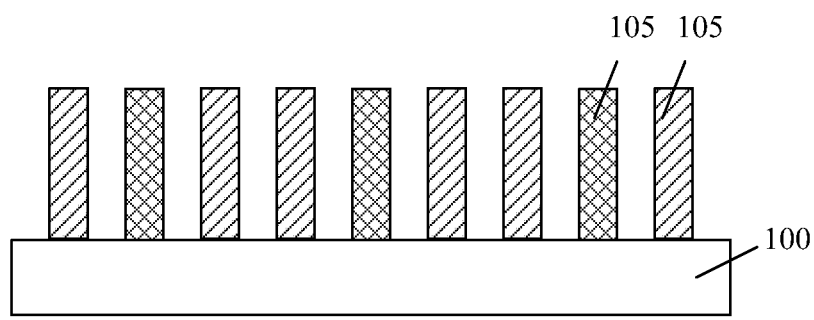
Figure 5:
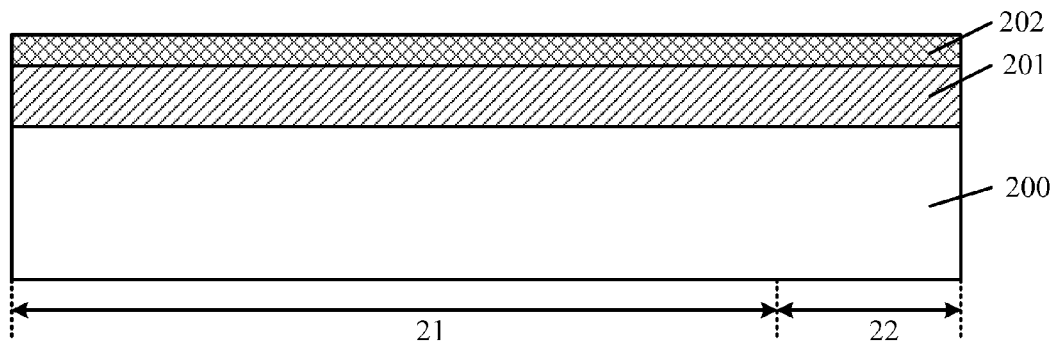
FIGS. 5~13 illustrate semiconductor structures corresponding to certain stages of an exemplary triple patterning process consistent with the disclosed embodiments.

As shown in FIG. 14, at the beginning of the triple patterning process, a substrate with certain structures is provided (S101). FIG. 5 illustrates a corresponding semiconductor structure.

As shown in FIG. 5, a substrate 200 is provided. The substrate 200 may have a first region 21 and a second region 22. Triple patterns may be subsequently formed in the first region 21. The triple patterns may be formed using core patterns (first patterns), second patterns, third patterns and fourth patterns. Further, fifth patterns with a size different from the size of the triple patterns may be subsequently formed in the second region 22, thus the second region 22 may be referred as peripheral region of the first region 21. A first material layer 201 may be formed on the surface of the substrate 200; and a second material layer 202 may be formed on the surface of the first material layer 201.

The substrate 200 may provide a base for subsequent structures and processes, the first material layer 201 may be used as a to-be-etched layer to subsequently form triple patterns. The triple patterns may be used as a mask for subsequently etching the substrate 200 to form semiconductor structures and devices.

The substrate 200 may be made of any appropriate semiconductor materials, such as silicon, silicon on insulator (SOI), germanium on insulator (GOI) silicon germanium, carborundum, indium antimonide, lead telluride, indium arsenide, indium phosphide, gallium arsenidie, gallium antimonite, or alloy semiconductor, etc. The substrate 200 may also be made of any appropriate dielectric material or insulation material, such as silicon oxide, silicon nitride, silicon oxynitride, or silicon carbonitride, etc. Further, the substrate 200 may also be made of metal, or metal compounds, such as W, Al, Cu, Ti, Ta, Co, TaN, NiSi, CoSi, TiN, TiAl or TaSiN, etc. Further, the substrate 200 may be other appropriate to-be-etch material.

In one embodiment, the substrate 200 may be a single layer structure. In certain other embodiments, the substrate 200 may be a multiple-stacked structure. In certain other embodiments, the substrate 200 may be the to-be-etched layer; and triple patterns may be formed in the substrate 200.

The first material layer 201 may be used to subsequently form triple patterns and fifth patterns. The first material layer 201 may be made of any appropriate material, such as poly silicon, amorphous silicon, amorphous carbon, SiN, SiON, SiCN, SiC, metal, or metal nitride, etc. The first material layer 201 may be a single layer structure, or a multiple-stacked structure. In one embodiment, the first material layer 201 is a single layer structure made of SiN. The thickness of the first material layer 210 may be in a range of approximately 300 Å~2000 Å.

Various processes may be used to form the first material layer 201, such as a chemical vapor deposition (CVD) process, a physical vapor deposition (PVD) process, a flowable CVD (FCVD) process, an epitaxial growth process, or an atomic layer deposition (ALD) process, etc. In one embodiment, the first material layer 201 is formed by a CVD process.

The second material layer 202 may be used to subsequently form core patterns. The second material layer 202 may be made of a material different from the first material layer 201 and, thus, when the second material layer 202 is subsequently etched to form the core patterns, the first material layer 201 and the second material layer 202 may have a significantly high selective etching ratio. The second material layer 202 may be made of any appropriate material, such as poly silicon, amorphous silicon, amorphous carbon, SiN, SiON, SiCN, SiC, metal, or metal nitride, etc. In one embodiment, the second material layer 202 is made of TiN. The thickness of the second material layer 202 may be in a range of approximately 300 Å~2000 Å.

Various processes may be used to form the second material layer 202, such as a CVD process, a PVD process, an FCVD process, an epitaxial growth process, or an ALD process, etc. In one embodiment, the second material layer 202 is formed by a sputtering process.

Figure 6:
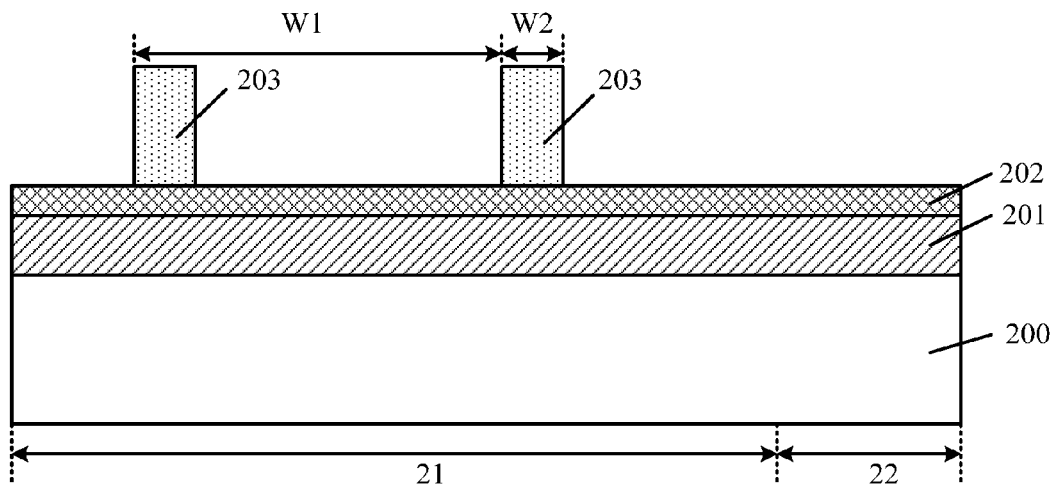

Returning to FIG. 14, after forming the second material layer 202, a plurality of discrete core patterns may be formed on the second material layer 202 in the first region 21 (S102). FIG. 6 illustrates a corresponding semiconductor structure.

As shown in FIG. 6, a plurality of discrete core patterns 203 (may also be refereed as sacrificial layers) are formed on the surface of the second material layer 202 in the first region 21. The distance between adjacent core patterns 203 may be referred as a first distance "W1", i.e., the period of the core patterns.

Sidewall spacers may be subsequently formed on side surfaces of the core patterns 203, after subsequently removing the core patterns 203, double patterns may be formed on the first material layer 201 by etching the second material layer 202 using the sidewall spacers as an etching mask.

The core patterns 203 may be made of a material different from the subsequently formed sidewall spacer material layer, thus when the core patterns 203 is formed and subsequently removed by etching processes, the core patterns 203, the subsequently formed sidewall spacer material layer and the second material layer 202 may have a significantly high selective etching ratio. Such a high selective etching ratio may cause the etching processes to only etch away a substantially small amount of the second material layer 202 and the subsequently formed sidewall spacer material layer, or to be unable to etch the second material layer 202 and the subsequently formed sidewall spacer material layer. The core patterns 203 may be made of any appropriate material, such as photoresist, poly silicon, amorphous silicon, amorphous carbon, SiN, SiON, SiCN, SiC, metal, or metal nitride, etc. In one embodiment, the core patterns 203 are made of photoresist, or amorphous carbon. It may be easier to subsequently remove the sacrificial layers 203 made of photoresist or amorphous carbon.

A process for forming the core patterns 203 may include forming a core pattern thin film on the surface of the second material layer 202; forming a patterned photoresist layer on the core patterns thin film; and etching the core pattern thin film using the patterned photoresist layer as an etching mask, thus the discrete core patterns 203 may be formed.

In certain other embodiments, if the core patterns 203 are made of photoresist, the core patterns 203 may be formed by directly patterning a photoresist layer by a standard photolithography process.

Various processes may be used to form the core pattern thin film, such as a CVD process, a PVD process, an ALD process, a spin coating process, etc.

Referring to FIG. 6, the number of the core patterns 203 may be at least greater than two. In one embodiment, for illustrative purposes, two core patterns 203 are used for the description.

Further, referring to FIG. 6, the distance between adjacent core patterns 203 is referred as a first distance "W1" (or a first interval or period). The first distance "W1" may be smaller than approximately 270 nm; and greater than approximately 90 nm. After the present triple patterning process, the distance between adjacent triple patterns may be smaller than approximately 90 nm, thus the minimum critical dimension (CD) limitation of the existing photolithography process may be overcome.

The width "W2" of each of the core patterns 203 may be smaller than ⅓ of the first distance "W1". In one embodiment, the width "W2" of each of the core patterns 203 may be equal to approximately ⅙ of the first distance "W1".

In certain other embodiments, the distances between adjacent sacrificial layers 203 may be different; and the widths of different sacrificial layers 203 may be different.

Figure 7:
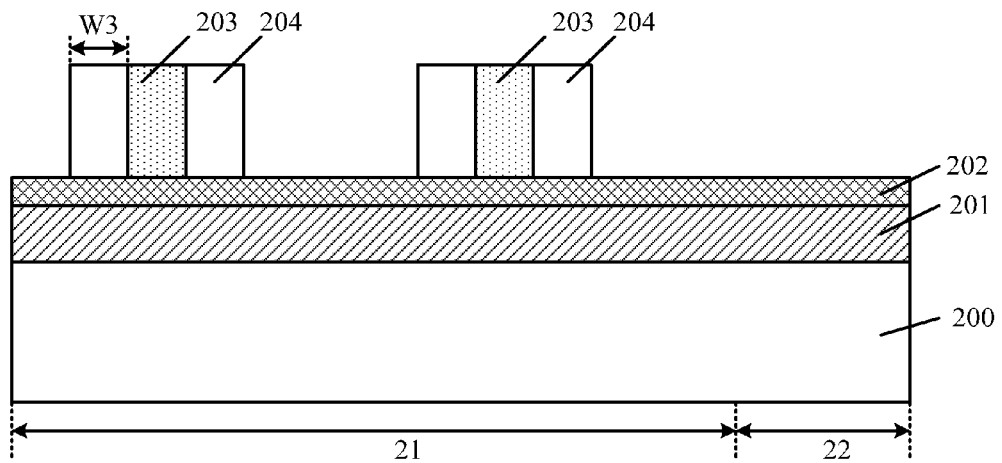

Returning to FIG. 14, after forming the core patterns 203, sidewall spacers may be formed (S103). FIG. 7 illustrates a corresponding semiconductor structure.

As shown in FIG. 7, sidewall spacers 204 are formed on the side surfaces of the core patterns 203.

A process for forming the sidewall spacers 204 may include forming a sidewall spacer material layer on the surfaces of the core patterns 203 and the surface of the second material layer 202; and performing a mask-less etching process (an etch back process) to remove portions of the sidewall spacer material layer on the top surfaces of the core patterns 203 and the surface of the second material layer 202, thus the sidewall spacers 204 may be formed on the side surfaces of the core patterns 203.

The sidewall spacers 204 may be made of a material different from the second material layer 202. The sidewall spacers 204 may be made of any appropriate material, such as poly silicon, amorphous silicon, amorphous carbon, SiN, SiON, SiCN, SiC, SiO, metal, or metal nitride, etc. In one embodiment, the sidewall spacers 204 are made of silicon oxide.

Various processes may be used to form the sidewall spacer material layer, such as a CVD process, a PVD process, an ALD process, or an FCVD process, etc. The mask-less etching process may include a dry etching process, a wet etching process, or an ion beam etching process, etc.

Referring to FIG. 6 and FIG. 7, the width "W3" of the sidewall spacers 204 may be smaller than approximately ⅓ of the first distance "W1". In one embodiment, the width "W3" of the sidewall spacers 204 is approximately ⅙ of the first distance "W1".

Figure 8:
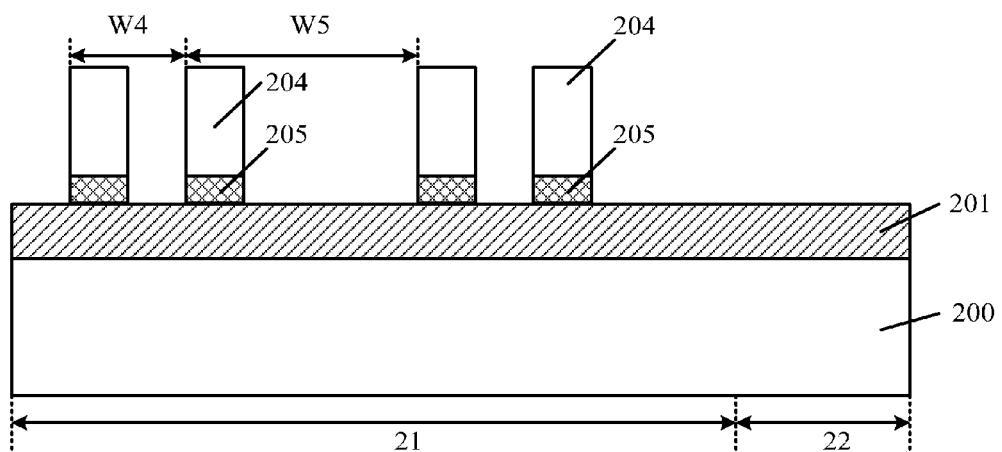

Returning to FIG. 14, after forming the sidewall spacers 204, the core patterns 203 may be removed; a plurality of discrete first patterns may be formed (S104). FIG. 8 illustrates a corresponding semiconductor structure.

As shown in FIG. 8, the core patterns 203 are removed; and a plurality of discrete first patterns 205 are formed on the surface of the first material layer 201 in the first region 21. The distances between adjacent first patterns 205 may be referred as a second distance "W4" and a third distance "W5"; and the second distance "W4" may be smaller than the third distance "W5". In one embodiment, the second distance "W4' may be approximately ⅓ of the first distance "W1"; and the third distance "W5" may be approximately ⅔ of the first distance "W1"

The core patterns 203 may be removed by any appropriate process, such as a dry etching process, or a wet etching process, etc. In one embodiment, the core patterns 203 are removed by an oxygen-contained plasma ashing process.

The first patterns 205 may be formed by etching the second material layer 202 using the sidewall spacers 204 as an etching mask, thus the process for forming the first patterns 205 may be referred as a sidewall image transfer (SIT) process. The second material layer 202 may be etched by any appropriate process, such as a dry etching process, a wet etching process, or an ion beam etching process, etc. In one embodiment, an anisotropic plasma etching process is used to etch the second material layer 202 to form the first patterns 205.

Optionally and additionally, after forming the first patterns 205, each of the first patterns 205 may be etched to form a plurality of smaller sub first patterns. In certain other embodiments, the sub first patterns may be formed after subsequently forming triple patterns and fifth patterns.

Figure 9:
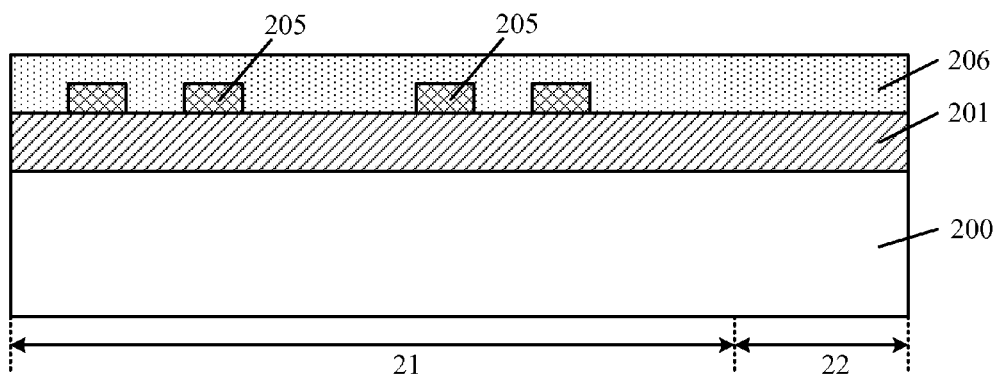

Returning to FIG. 14, after forming the first patterns 205, the sidewall spacers 204 may be removed; a third material layer may be formed (S105). FIG. 9 illustrates a corresponding semiconductor structure.

As shown in FIG. 9, the sidewall spacers 204 are removed; and a third material layer 206 are formed on the surfaces of the first material layer 201 and the first patterns 205. The surface of the third material layer 206 may be higher than the top surfaces of the first patterns 205

The sidewall spacers 204 may be removed by any appropriate process, such as a dry etching process, or a wet etching process, etc.

The third material layer 206 may be made of a material different from the second material layer 202 (the first patterns 205). The third material layer 206 may be made of any appropriate material, such as poly silicon, amorphous silicon, amorphous carbon, SiN, SiON, SiCN, SiC, metal, or metal nitride, etc. In one embodiment, the third material layer 206 is made of amorphous silicon.

Various processes may be used to form the third material layer 206, such as a CVD process, a PVD process, an ALD process, or an epitaxial growth process, etc. In one embodiment, the third material layer 206 is formed by a CVD process.

Figure 10:
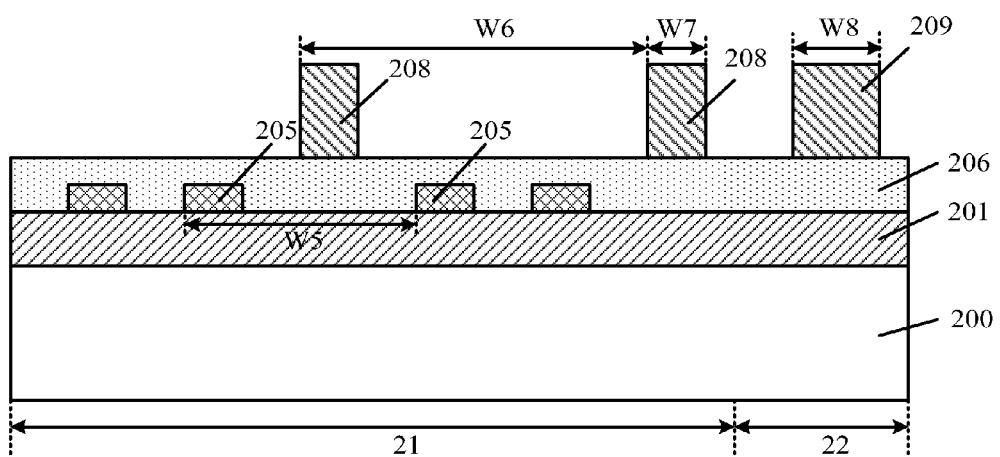

Returning to FIG. 14, after forming the third material layer 206, a plurality of second patterns and a plurality of third patterns may be formed on the third material layer 206 (S106). FIG. 10 illustrates a corresponding semiconductor structure.

As shown in FIG. 10, a plurality of discrete second patterns 208 are formed on the third material layer 206 in the first region 21; and the plurality of second patterns 208 are formed on the third material layer 206 between the first patterns 205 with the third distance "W5" in the first region 21. Further, a plurality of third patterns 209 are formed on the third material layer 206 in the second region 22. For illustrative purposes, two second patterns 208 and one third pattern 209 are used in the description.

The second patterns 208 and the third patterns 209 may be made of a material different from the third material layer 206. The second patterns 208 and the third patterns 209 may be made of any appropriate material, such as photoresist, poly silicon, amorphous silicon, amorphous carbon, SiN, SiON, SiCN, SiC, metal, or metal nitride, etc.

In one embodiment, the second patterns 208 and the third patterns 209 are made of photoresist. A process for forming the second patterns 208 and the third patterns 209 may include forming a photoresist layer on the third material layer 206; and exposing and developing the photoresist layer, thus the second patterns 208 and the third patterns 209 may be formed on the surface of the third material layer 206.

Referring to FIG. 10, the second patterns 208 may be formed on the surface of the third material layer 206 between adjacent first patterns 205 with the third distance "W5"; fourth patterns may be subsequently formed between the adjacent first patterns 205 with the third distance "W5" by etching the third material layer 206 using the second patterns 208 as an etching mask; and triple patterns may be subsequently formed on the substrate 200 by etching the first material layer 201 using the first patterns 205 and the subsequently formed fourth patterns as an etching mask.

A width "W7" of each of the second patterns 208 may be smaller than the third width "W5". The distance "W6" between adjacent second patterns 208 may be greater than ½ of the first distance "W1"; and smaller than 1.5 times of the first distance "W1". Such distances may cause the plurality of the second patterns 208 to be formed on the second material layer 202 between adjacent first patterns 205 with the third distance "W5". In one embodiment, the width "W7" of the second patterns 208 may be equal to the width "W3" of the first patterns 205; and the distance "W6" between adjacent second patterns 208 may be equal to the first distance "W1", thus the width of the subsequently formed triple patterns and the distances between adjacent subsequently formed triple patterns may be equal.

The width of the third patterns 209 may be equal to; or different from the width "W7" of the second patterns 208. The distance between adjacent third patterns 209 may be equal to, or different from the distance "W6" between adjacent second patterns 208.

In order to subsequently form fifth patterns with a width and a distance between adjacent fifth patterns different from the subsequently formed triple patterns, and so as to match the diversified needs of fabrication processes, the width "W8" of the third patterns 209 may be different from the width "W7" of the second patterns 208; and the width "W8" of the third patterns 209 may be greater than the width "W7" of the second patterns 208. Therefore, the size of the subsequently formed fifth patterns may be greater than the subsequently formed triple patterns. In one embodiment, the size of the third patterns 209 may be greater than 10 μm.

In one embodiment, the distance between adjacent third patterns 209 may be different from the distance "W6" between adjacent second patterns 208. The distance between adjacent third patterns 209 may be greater than ⅓ of the first distance "W1".

The distance between adjacent third patterns 209 may be greater than the minimum critical dimension (CD) of the photolithography process, thus the third patterns 209 may be formed by the photolithography process, and they may be unnecessarily formed by a multiple patterning process. Herein, the minimum CD of the photolithography process may refer to the minimum line width of the obtained semiconductor patterns when the resolution of the photolithography system is minimum.

In certain other embodiments, the width "W7" of the second patterns 208, the distance "W6" between adjacent second patterns 208, the width "W8" of the third patterns 209 and the distance between adjacent third patterns 209 may be any other values determined by certain process requirements.

Figure 11:
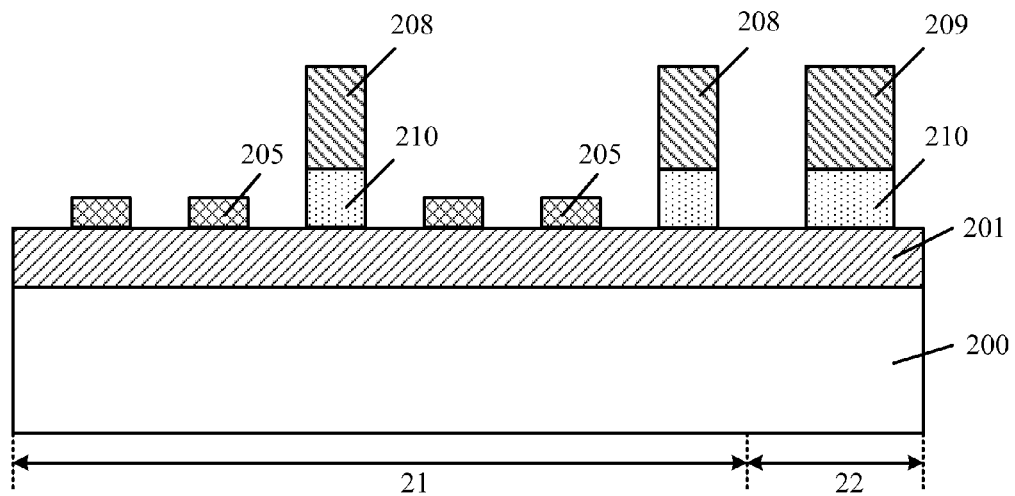

Returning to FIG. 14, after forming the second patterns 208 and the third patterns 209, fourth patterns may be formed (S107). FIG. 11 illustrates a corresponding semiconductor structure.

As shown in FIG. 11, fourth patterns 210 are formed on the surface of the first material layer 201. The fourth patterns 210 may be formed by etching the third material layer 206 as an etching mask.

Various processes may be used to etching the third material layer 206, such as a dry etching process, a wet etching process, or an ion beam etching process, etc. In one embodiment, an anisotropic plasma etching process is used to etch the third material layer 206 to form the fourth patterns 210.

The width of the fourth patterns 210 formed on the first material layer 201 in the first region 21 and the distance between adjacent fourth patterns 210 formed on the first material layer 201 in the first region 21 may correspond to the width "W7" of the second patterns 208 and the distance "W6" of adjacent second patterns 208. The width of the fourth patterns 210 formed on the first material layer 201 in the second region 22 and the distance between adjacent fourth patterns 210 formed on the first material layer 201 in the second region 22 may correspond to the width "W8" of the third patterns 209 and the distance between adjacent third patterns 209.

Returning to FIG. 14, after forming the fourth patterns 210, triple patterns and fifth patterns may be formed (S108). FIG. 12 illustrates a corresponding semiconductor structure.

As shown in FIG. 12, triple patterns 211 are formed on the substrate 200 in the first region 21; and fifth patterns 212 are formed on the substrate 200 in the second region 22. The triple patterns 211 and the fifth patterns 212 may be formed by etching the first material layer 201 using the first patterns 205, the second patterns 208, the third patterns 209 and the fourth patterns 210 as an etching mask.

Various processes may be used to etch the first material layer 201, such as a dry etching process, a wet etching process, or an ion beam etching process, etc. In one embodiment, an isotropic dry etching process is used to etch the first material layer 201 to form the triple patterns 211 and the fifth patterns 212.

After forming the triple patterns 211 and the fifth patterns 212, as shown in FIG. 13, the first patterns 205, the second patterns 208, the third patterns 209 and the fourth patterns 210 may be removed. Various processes may be used to remove the first patterns 205, the second patterns 208, the third patterns 209 and the fourth patterns 210, such as a dry etching process, or a wet etching process, etc.

In one embodiment, the widths of the triple patterns 211 may be same. The distances between adjacent triple patterns 211 may also be same. The width of the fifth patterns 212 may be greater than the width of the triple patterns 211. The fifth patterns 212 may be used to monitoring certain fabrication processes. The fifth patterns 212 may also be used to define periphery devices. Thus, the fifth patterns 212 with the size different from the triple patterns 211 and the triple patterns 211 may be formed simultaneously; and the diversified needs of the semiconductor manufacturing may be matched.

In certain other embodiments, the widths of the triple patterns 211 may be different. The distances between adjacent triple patterns 211 may be different. The width of the fifth patterns 212 may be smaller than the width of the triple patterns 211, however, further processes may be needed.

Further, after forming the triple patterns 211 and the fifth patterns 212, an etching process may be performed to divide each of the triple patterns 211 and each of the fifth patterns 212 into a plurality of discrete sub triple patterns and a plurality of discrete sub fifth patterns. Thus, when semiconductor devices are subsequently formed, the integration level of the semiconductor devices may be improved.

Thus, a semiconductor structure may be formed by above disclosed methods and processes; and a corresponding semiconductor structure is illustrated in FIG. 13. As shown in FIG. 13, the semiconductor structure includes a substrate 200 having a first region 21 and a second region 22. The semiconductor structure also includes a plurality of triple patterns 211 formed on the semiconductor substrate 200 in the first region 21. Further, the semiconductor structure includes a plurality of fifth patterns 212 with a size different from the width of the triple patterns 211 formed on the substrate 200 in the second region 22.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A triple patterning method, comprising:
   providing a substrate having a first region and a second region;
   forming a first material layer on the substrate;
   forming a second material layer on the first material layer;
   forming a plurality of core patterns on the second material layer in the first region;
   forming sidewall spacers on side surfaces of the core patterns;
   forming first patterns on the first material layer by etching the second material layer using the sidewall spacers as an etching mask;
   forming a third material layer on the first material layer and the first patterns;
   forming a plurality of second patterns on the third material layer in the first region and a plurality of the third patterns on the third material layer in the second region;
   forming fourth patterns by etching the third material layer using the second patterns and the third patterns as an etching mask; and
   forming triple patterns on the substrate in the first region and fifth patterns on the substrate in the second region using the first patterns, the second patterns, the third patterns and the fourth patterns as an etching mask.

2. The method according claim 1, before forming the first patterns, further including:
   removing the core patterns.

3. The method according claim 1, before forming the third material layer, further including:
   removing the sidewall spacers.

4. The method according to claim 1, after forming the first patterns, further including:
   forming a plurality of sub first patterns by etching each of the first patterns.

5. The method according claim 1, after forming the triple patterns and the fifth patterns, further including:
   forming a plurality of sub triple patterns and a plurality of sub fifth patterns by etching each of the triple patterns and etch of the fifth patterns.

6. The method according to claim 1, wherein:
   a width of the core patterns is equal to approximately ⅙ of a distance between adjacent core patterns.

7. The method according to claim 6, wherein:
   the distance (a first distance) between adjacent core patterns is in a range of approximately 90 nm~270 nm.

8. The method according to claim 1, wherein:
   a width of the fifth patterns is greater than a width of the triple patterns.

9. The method according to claim 8, wherein:
   the width of the fifth patterns is equal to, or greater than approximately 10 μm.

10. The method according to claim 7, wherein:
    distances between adjacent first patterns include a second distance and a third distance;
    the third distance is greater than the second distance;
    the second distance is approximately ⅓ of the first distance; and
    the third distance is approximately ⅔ of the first distance.

11. The method according to claim 1, wherein:
    the first material layer is made of a material different from a material of the second material layer;
    the first material layer is made of poly silicon, amorphous silicon, amorphous carbon, SiN, SiON, SiCN, SiC metal or metal nitride; and
    the second material layer is made of poly silicon, amorphous silicon, amorphous carbon, SiN, SiON, SiCN, SiC metal or metal nitride.

12. The method according to claim 1, wherein:
    a width of the second patterns is different from a width of the third patterns.

13. The method according to claim 1, wherein:
    a distance between adjacent third patterns is different from a distance between adjacent second patterns.

14. The method according to claim 13, wherein:
    the distance between adjacent third patterns is greater than ⅓ of the first distance.

15. The method according to claim 10, wherein:
    a width of the second patterns is smaller than the second distance; and
    a distance between two adjacent second patterns is greater than approximately ½ of the first distance and smaller than approximately 1.5 times of the first patterns.

16. The method according to claim 15, wherein:
    the width of the second patterns is equal to the width of the first patterns; and
    the distance between two adjacent second patterns is equal to the first distance.

* * * * *